(12) United States Patent
Eussen et al.

(10) Patent No.: US 7,310,130 B2
(45) Date of Patent: Dec. 18, 2007

(54) LITHOGRAPHIC APPARATUS AND POSITION MEASURING METHOD

(75) Inventors: Emiel Jozef Melanie Eussen, Margraten (NL); Tjarko Adriaan Rudolf Van-Empel, Eindhoven (NL); Wouter Onno Pril, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 276 days.

(21) Appl. No.: 10/957,755

(22) Filed: Oct. 5, 2004

(65) Prior Publication Data
US 2006/0072089 A1    Apr. 6, 2006

(51) Int. Cl.
    *G03B 27/42* (2006.01)
    *G01B 11/00* (2006.01)
(52) U.S. Cl. .......................... 355/53; 356/399
(58) Field of Classification Search ............. 355/53, 355/55, 401, 76, 30, 67; 356/399, 2, 614, 356/363; 250/441.11
See application file for complete search history.

(56) References Cited

U.S. PATENT DOCUMENTS

| 4,750,808 | A | * | 6/1988 | Nash et al. ............... 359/451 |
| 4,786,947 | A | * | 11/1988 | Kosugi et al. ............. 355/30 |
| 5,892,572 | A | * | 4/1999 | Nishi ....................... 355/67 |
| 5,963,324 | A | | 10/1999 | Murata |
| 6,144,442 | A | * | 11/2000 | 'T Mannetje et al. ........ 355/73 |
| 6,603,128 | B2 | * | 8/2003 | Maehara et al. ......... 250/441.11 |
| 6,614,503 | B1 | * | 9/2003 | Uzawa ...................... 355/30 |
| 2002/0186377 | A1 | * | 12/2002 | Kuskovsky et al. ........ 356/457 |
| 2003/0020888 | A1 | * | 1/2003 | Tanaka et al. .............. 355/30 |

FOREIGN PATENT DOCUMENTS

| EP | 1 424 597 A2 | 6/1994 |
| JP | 9-186065 | 11/1997 |
| TW | 579541 | 3/2004 |
| WO | WO 2004/042319 A2 | 5/2004 |
| WO | WO 2004/042319 A3 | 5/2004 |

OTHER PUBLICATIONS

European Search Report issued for European Patent Application No. EP 05 07 7238, dated Dec. 8, 2005.

* cited by examiner

*Primary Examiner*—Henry Hung Nguyen
*Assistant Examiner*—Kevin Gutierrez
(74) *Attorney, Agent, or Firm*—Pillsbury Winthrop Shaw Pittman LLP

(57) ABSTRACT

In a lithographic apparatus, a measurement of the position of an object in an ambient space by an object position measuring system which is influenced by pressure variations in the ambient space, is corrected by an accurate measurement of the pressure in the ambient space. A pressure difference is measured between a pressure in a reference pressure volume and an ambient pressure in an ambient space. An absolute pressure in the reference pressure volume is added to the pressure difference to determine a change of pressure in the ambient space. Alternatively, the pressure difference is integrated over time and a determined change of pressure in the reference pressure volume is added to the pressure difference to determine a change of pressure in the ambient space.

25 Claims, 2 Drawing Sheets

LITHOGRAPHIC APPARATUS AND POSITION MEASURING METHOD

BACKGROUND

1. Field of the Invention

The present invention relates to lithographic apparatus and methods.

2. Description of the Related Art

In order to determine a position of an object very accurately, an object position measuring system, such as a laser interferometer system, may be used. In a laser interferometer system, which is an incremental system where the wavelength of the laser light used constitutes a measurement unit, a reflection of a laser beam against a reflecting surface of the object is measured and compared with an internal reference path. If the object position changes in line with the laser beam, the comparison between the reference and the measuring laser beam will show a number of interference transitions (consisting of constructive/destructive interference between the measuring path and the reference path) which is proportional to the displacement. The number of interference transitions is not only proportional to the displacement, but also with the wavelength of the laser light. In particular, the number of interference transitions is equal to the change of length of the optical path as a result of the displacement, divided by the wavelength.

The wavelength of light in air depends on the nominal wavelength in vacuum, divided by the refractive index of the medium through which the light travels. The refractive index in air $n_{air}$ may be described by the so-called Edlen formula (B. Edlen, The refractive index of air, Metrologia, Vol. 2, nr. 2, pp. 71-80 (1966), included herein by reference):

$$n_{air} = \frac{D \cdot 0.104126 \cdot 10^{-4} \cdot P}{1 + 0.003671 \cdot T} - 0.42066 \cdot 10^{-9} \cdot F + 1 \quad (1)$$

wherein:
$D = 0.27651754 \cdot 10^{-3}(1 + 53.5 \cdot 10^{-8}(C-300))$
P corresponds to the pressure (of air) [Pa]
T corresponds to the temperature (of air) [° C.]
F corresponds to the partial water vapor pressure [Pa], and
C corresponds to the $CO_2$ concentration [ppm]

Another version of formula (1), in which the basic interdependencies of the parameters are unchanged, is described in K. P. Birch, M. J. Downs, 1994, Correction of the updated Edlen equation for the refractive index of air, Metrologia 31, pp. 315-316 (included herein by reference).

It will be appreciated that $n_{air}$, in formula (1), depends on the pressure of the air as well as on other parameters which are not considered in more detail in the context of the present invention.

Consequently, when measuring a position with a laser interferometer system, it is desirable to take into account the pressure of the air. When the pressure is accurately known, the refractive index may be accurately determined. Further, the number of interference transitions ("fringe count") may be accurately determined in the laser interferometer system. Combining the results of the pressure determination and the fringe count, the position sought may be accurately determined.

It results from the foregoing discussion that, in order to accurately measure an object position in a medium, such as air, using a laser interferometer system or any other measurement system based on the determination of a number of wavelengths, it is desirable to accurately determine the pressure of the medium.

A lithographic apparatus is an example of a tool, in which high accuracy of position measurement is desired. A lithographic apparatus generally employs a laser interferometer measurement system.

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned.

Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In a lithographic apparatus, the mask and the substrate (or their respective stages, commonly referred to as reticle stage (or mask table or patterning support) and wafer stage (or substrate table or substrate support)) should be positioned accurately. For this purpose, a laser interferometer system may be used. In an initialization phase, the accuracy of the alignment may be limited, since possible position offsets may be corrected by using alignment sensors for scaling on alignment marks previously provided on the mask and the substrate, or on the carriers thereof. After the initialization phase, when the alignment position is left, the alignment accuracy is generally high.

In view of the influence of the pressure on the actual wavelength, as explained above, in the initialization phase, the absolute pressure may be measured with a limited (absolute) accuracy, and be used to determine the actual wavelength with respect to the known value in vacuum, e.g. through formula (1) or its other version. Since, in the initialization phase, a scaling is performed using the alignment marks, the accuracy and the repeatability of the pressure measurement may be relatively low.

However, after the alignment of the reticle stage or wafer stage, pressure changes may directly influence the stage positioning. The scaling effect of a pressure change on the wavelength measured by the laser interferometer system is proportional to the actual pressure change over the absolute pressure.

It may be difficult with conventional pressure sensors to measure absolute pressure with a high accuracy, and to measure fast pressure changes with sufficient speed and accuracy.

SUMMARY

Embodiments of the invention include a method and an apparatus for measuring a position of an object in an ambient space very accurately with an object position measuring system under varying ambient pressure.

According to an embodiment of the invention, a method for measuring a position of an object in an ambient space is provided, the method including providing an object position meassuring system in the ambient space for measuring a position of the object; providing a reference pressure volume having a fluid connection with predetermined flow characteristics to the ambient space; measuring an absolute pressure in the reference pressure volume; measuring a pressure difference between a pressure in the reference pressure volume and an ambient pressure in the ambient space; adding the absolute pressure in the reference pressure volume, and the pressure difference to determine a change of pressure in the ambient space; and correcting the position measurement of the object position measuring system on the basis of the determined change of pressure in the ambient space.

According to an embodiment of the invention, a method for measuring a position of an object in an ambient space includes: providing an object position measuring system in the ambient space for measuring a position of the object; providing a reference pressure volume having a fluid connection with predetermined flow characteristics to the ambient space; measuring a pressure difference between a pressure in a reference pressure volume and an ambient pressure in the ambient space, integrating the pressure difference over a predetermined time interval for determining a change of pressure in the reference pressure volume; adding the pressure difference at an end of the predetermined time interval, and the change of pressure in the reference pressure volume to determine a change of pressure in the ambient space; correcting the position measurement of the object position measuring system on the basis of the determined change of pressure in the ambient space.

According to another embodiment of the invention, a method for measuring a position of an object in an ambient space includes providing an object position measuring system in the ambient space for measuring a position of the object; providing a reference pressure volume having a fluid connection to the ambient space which can be opened and closed; opening the connection; measuring a pressure difference between a pressure in the reference pressure volume and an ambient pressure in the ambient space after closing the connection to determine a change of pressure in the ambient space; and correcting the position measurement of the object position measuring system on the basis of the determined change of pressure in the ambient space.

According to a further embodiment of the invention, a method for measuring a position of an object in an ambient space includes: providing an object position measuring system in the ambient space for measuring a position of the object; providing a reference pressure volume having a fluid connection to the ambient space which can be opened and closed; opening the connection; measuring an absolute pressure in the reference pressure volume; measuring a pressure difference between a pressure in the reference pressure volume and an ambient pressure in the ambient space after closing the connection to determine a change of pressure in the ambient space; and correcting the position measurement of the object position measuring system on the basis of the determined change of pressure in the ambient space.

A method for measuring a position of an object in an ambient space, in accordance with an embodiment of the invention, includes measuring a pressure difference between a pressure in a reference pressure volume and an ambient pressure in the ambient space, the reference pressure volume having a fluid connection with predetermined flow characteristics to the ambient space; determining a change of pressure in the ambient space based on the pressure difference; and correcting a position measurement of the object on the basis of the determined change of pressure in the ambient space.

An apparatus for measuring a position of an object in an ambient space, in accordance with an embodiment of the invention, includes an object position measuring system arranged in the ambient space and configured to measure a position of the object; a reference pressure volume having a fluid connection to the ambient space, the fluid connection having predetermined flow characteristics; a differential pressure sensor configured to measure a pressure difference between a pressure in the reference pressure volume and an ambient pressure in the ambient space; a calculating unit configured to determine a change of pressure in the ambient space based on the pressure difference; and a corrector configured to correct the position measurement of the object position measuring system on the basis of the determined change of pressure in the ambient space.

A lithographic apparatus in accordance with an embodiment of the invention includes an illumination system configured to condition a radiation beam; a patterning support configured to support a patterning device, the patterning device being capable of imparting the radiation beam with a pattern in its cross-section to form a patterned radiation beam; a substrate table constructed to hold a substrate; a projection system configured to project the patterned radiation beam onto a target portion of the substrate; and a position measuring apparatus configured to measure a position of a device, the position measuring apparatus including an object position measuring system arranged in the ambient space and configured to measure a position of the device; a reference pressure volume having a fluid connection to the ambient space, the fluid connection having predetermined flow characteristics; a differential pressure sensor configured to measure a pressure difference between a pressure in the reference pressure volume and an ambient pressure in the ambient space; a calculating unit configured to determine a change of pressure in the ambient space based on the pressure difference; and a corrector configured to correct the position measurement of the object position measuring system on the basis of the determined change of pressure in the ambient space.

According to further embodiments of the invention, apparatus are provided embodying the above methods. More particularly, lithographic apparatus are provided implementing the above methods.

The accurate measurement of an object position is, according to embodiments of the invention, enabled by an accurate measurement of an ambient pressure.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
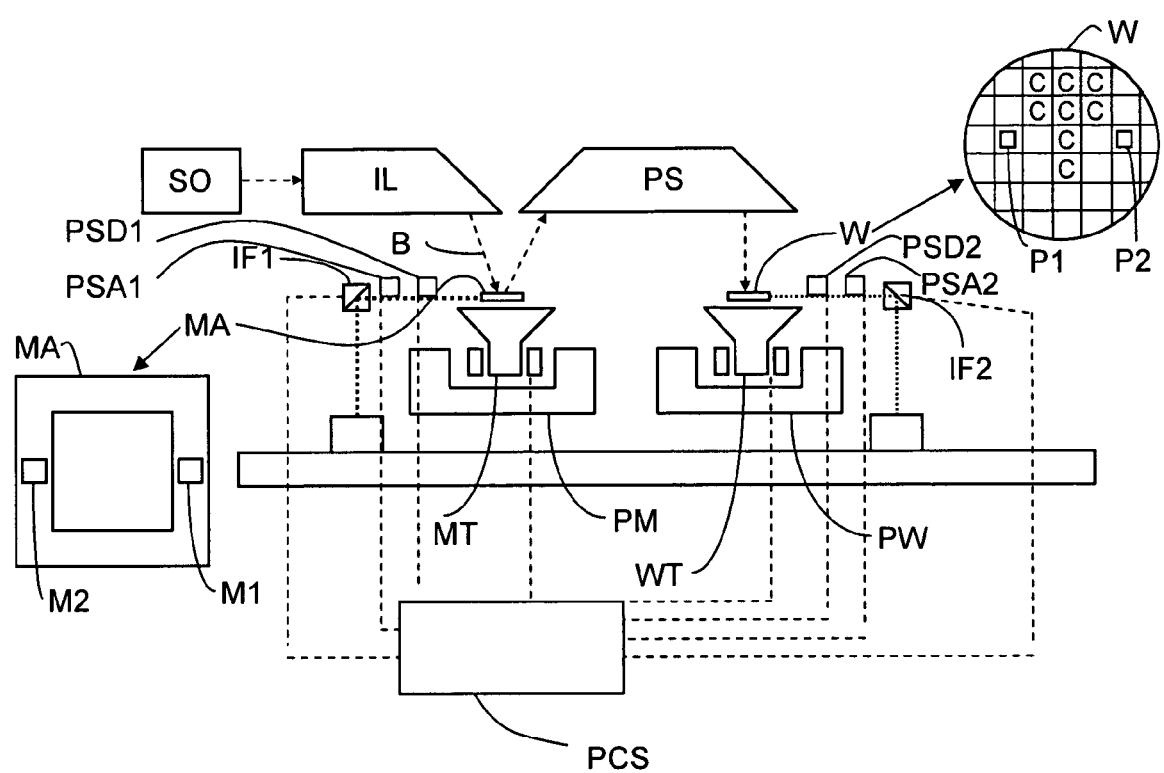
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or another suitable type of radiation) and a support structure or patterning device support (e.g. a mask table) MT configured to support a patterning device (e.g. a mask) MA and connected to a first positioning device PM configured to accurately position the patterning device in accordance with certain parameters. The apparatus also includes a substrate table or substrate support (e.g. a wafer table) WT configured to hold a substrate (e.g. a resist-coated wafer) W and connected to a second positioning device PW configured to accurately position the substrate in accordance with certain parameters, and a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation. The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted to as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables or substrate supports (and/or two or more mask tables or patterning device supports). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system (not shown) including, for example, suitable directing mirrors and/or a beam expander. In other cases the source may be an integral part of the lithographic apparatus, for example when the source is a mercury lamp. The source SO and the illuminator IL, together with the beam delivery system if used, may be referred to as a radiation system.

The illuminator IL may include an adjuster (not shown) configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator (not shown) and a condenser (not shown). The illuminator may be used to condition the radiation beam, to have a desired uniformity and intensity distribution in its cross-section.

The radiation beam B is incident on the patterning device (e.g., mask MA), which is held on the support structure (e.g., mask table MT or patterning device support), and is patterned by the patterning device. After being reflected on the mask MA, the radiation beam B passes through the projection system PS, which focuses the beam onto a target portion C of the substrate W. With the aid of the second positioning device PW and position sensor IF2 (e.g. an interferometric device, linear encoder or capacitive sensor), the substrate table or substrate support WT can be moved accurately, e.g. so as to position different target portions C in the path of the radiation beam B. Similarly, the first positioning device PM and another position sensor IF1 can be used to accurately position the mask MA with respect to the path of the radiation beam B, e.g. after mechanical retrieval from a mask library, or during a scan. In general, movement of the mask table or patterning device support MT may be realized with the aid of a long-stroke module (coarse positioning) and a short-stroke module (fine positioning), which form part of the first positioning device PM. Similarly, movement of the substrate table WT may be realized using a long-stroke module and a short-stroke module, which form part of the second positioning device PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

Step mode: the mask table or patterning device support MT and the substrate table or substrate support WT are kept essentially stationary, while an entire pattern imparted to the radiation beam is projected onto a target portion C at once (i.e. a single static exposure). The substrate table WT is then shifted in the X and/or Y direction so that a different target portion C can be exposed. In step mode, the maximum size of the exposure field limits the size of the target portion C imaged in a single static exposure.

Scan mode: the mask table or patterning device support MT and the substrate table or substrate support WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

Another mode: the mask table or patterning device support MT is kept essentially stationary holding a programmable patterning device, and the substrate table or substrate support WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

The positioning devices PM and PW described above may each be coupled to a position control system PCS which, in turn, may be coupled to laser interferometer position sensors IF1 and IF2, respectively, for accurately positioning the mask table or patterning device support MT and the substrate table or substrate support WT, respectively. In FIG. 1, such a coupling is indicated schematically with a dashed line. The position control system PCS may be coupled to an absolute pressure sensor PSA1 to determine an absolute pressure in a measuring region of position sensor IF1. Further, the position control system PCS may be coupled to an absolute pressure sensor PSA2 to determine an absolute pressure in a measuring region of position sensor IF2. With the absolute pressure values measured by the absolute pressure sensors PSA1, PSA2, the wavelength of the laser light used by the position sensors IF1, IF2, respectively, may be determined, and the measurements made by the position sensors IF1, IF2 may be corrected thereby.

Instead of using separate absolute pressure sensors PSA1, PSA2 for each position sensor IF1, IF2, one absolute pressure sensor may be used for both position sensors IF1, IF2. If the positions of the mask table MT and/or the substrate table WT are determined by other systems than the laser interferometer position sensors IF1 and/or IF2, then the absolute pressure sensors PSA1 and/or PSA2 may be omitted. If an initial positioning of the mask table MT and/or the substrate table WT is established solely by, or with the aid of other systems (such as alignment marks on the mask or the mask table MT, and/or alignment marks on the substrate or the substrate table WT) than the laser interferometer position sensors IF1 and/or IF2, then the absolute pressure sensors PSA1 and/or PSA2 may also be omitted.

The position control system PCS may be coupled to differential pressure sensors PSD1, PSD2 to determine a relative pressure in a measuring region of position sensors IF1, IF2, respectively. Details of the arrangement of the differential pressure sensors PSD1, PSD2 will be given below with reference to FIGS. 2-4.

Figure 2:
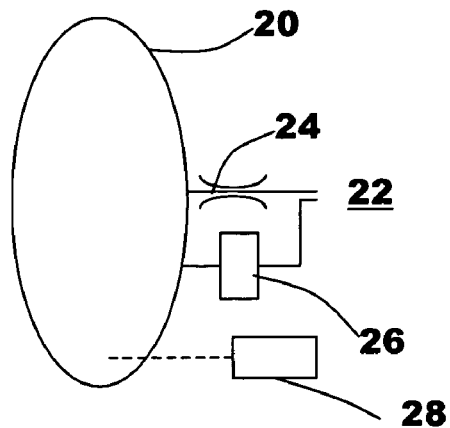
FIG. 2 schematically depicts a part of a positioning device according to an embodiment of the invention.

FIG. 2 shows a reference pressure volume 20, which is closed, apart from an open connection to an ambient space 22 through a capillary 24 with known flow characteristics. The reference pressure volume 20 (hereinafter also to be referred to as a vessel 20) is further connected to one side of a differential pressure sensor 26 (such as PSD1, PSD2), the other side of which is in open connection with the ambient space 22. In an embodiment of the invention, the other side is substantially at the same location as the capillary 24. With this arrangement, pressure changes in the ambient space may be measured very quickly and accurately, as explained below.

The pressure in the ambient space can be represented by a function of time P(t), the pressure in the vessel can be represented by $P_v(t)$, and the differential pressure across the differential pressure sensor 26 can be represented by $\Delta P(t)$. Then:

$$\Delta P(t) = P(t) - P_v(t)$$

which is equivalent to:

$$\Delta P(t) = P(t) - P(t) \cdot \frac{1}{sRV + 1}$$

wherein:

s corresponds to the differential operator d/dt

R corresponds to the flow resistance of capillary 24 [Pa*s*m$^{-3}$]; and

V corresponds to the capacity of vessel [m$^3$*Pa$^{-1}$]

It follows that:

$$P(t) = \Delta P(t) + \frac{1}{RV}\int_o^t \Delta P(u)du + P_o \qquad (2)$$

wherein $P_0$ (integration constant) is the pressure at t=0.

The pressure changes at $t=t_1$ (since $t=t_0$) $\Delta P_{since t0}(t_1)$ is now:

$$\Delta P_{since\_t0}(t_1) = P(t_1) - P_0$$

$$\Delta P_{since\_t0}(t_1) = \Delta P(t_1) + \frac{1}{RV}\int_o^{t1} \Delta P(u)du$$

From the above formula (2), it follows that the actual pressure P(t) in the ambient space 22 can be calculated when the constants $P_0$, R and V are known. $P_0$ can be measured by an absolute pressure sensor (such as PSA1, PSA2). R en V follow from the design chosen.

For a calculation of the change of the actual pressure the constant $P_0$ need not be known. This is a great advantage when a position to be measured by an interferometer system is known at a time $t_0$, and the pressure change of the vessel is known (which may be determined by the differential pressure sensor measurements in combination with the known capillary flow resistance, since the flow through the capillary 24 is proportional with the differential pressure).

It is observed that, due to changes in the absolute pressure, the properties of the gas flowing through the capillary 24 may change, and therefore the accuracy of the flow prediction underlying the calculation of the pressure change of the reference pressure vessel 20 can only be guaranteed over a limited range of absolute pressure.

Figure 3:
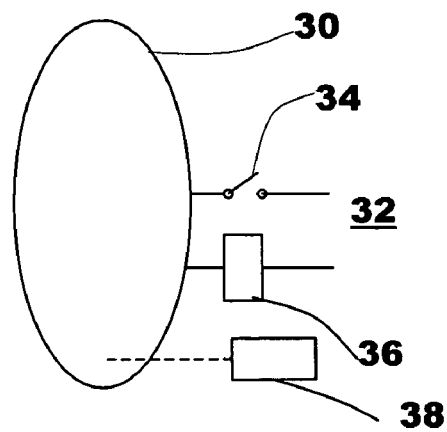
FIG. 3 schematically depicts a part of a positioning device according to another embodiment of the invention.

As illustrated in FIG. 3, a vessel 30 may also be connected to an ambient space 32 by a schematically indicated valve 34 which can be opened and closed in a manner known per se, e.g. by a controlled actuator. In the position shown in FIG. 3, the valve 34 is closed, thereby isolating the vessel 30 from the ambient space 32. A pressure difference between the vessel 30 and the ambient space 32 can be measured by a differential pressure sensor 36. When the valve 34 is open, there is no pressure difference across the differential pressure sensor 36, while a pressure difference may build up across the differential pressure sensor 36 when the valve 34 is closed.

The actual pressure P(t) in the ambient space 32 may be determined as the sum of $P_0$ and the differential pressure $\Delta P(t)$ when the valve 34 is closed. $P_0$ can be measured by an absolute pressure sensor (such as PSA1, PSA2).

The constant $P_0$ need not be known to calculate the change of the actual pressure in the ambient space. This is a great advantage when a position to be measured by an interferometer system is known at a time $t_0$, and the pressure change of the ambient space is known (which may be determined by the differential pressure sensor measurements). The valve 34 may be opened before the measurement, and may be closed at the time $t_0$ and during measurement.

In a further embodiment of the invention, a capillary and a valve may be connected in parallel, where the valve may be opened before the measurement, ensuring that the pressure difference across the differential pressure sensor is equal to zero (function as in FIG. 3), while the valve may be closed at the time $t_0$ and during the measurement (function as in FIG. 2).

It is observed that the temperature of the vessel 20 (FIG. 2) or vessel 30 (FIG. 3) should be very stable (e.g. in the order of 1 mK or less) in order to reduce pressure changes induced by temperature changes. Also, the reverse should be avoided: pressure changes in the vessel 20, 30 (in particular in the vessel 20 by gas flowing through the capillary 24) induce adiabatic temperature effects in the vessel. When the gas expands in the vessel, due to a decreasing ambient pressure, the temperature of the gas will decrease due to an adiabatic expansion. In an embodiment of the invention, the vessel 20, 30 may contain a fine mesh of highly conductive material which is temperature conditioned in order to provide temperature stability.

Further it is observed that the volume of the vessel 20, 30 may change due to external effects like temperature and force. In an embodiment of the invention, the vessel 20, 30 is made of a non-expanding material (non-expanding when subjected to temperature changes, and non-expanding due to external forces) to prevent a change of volume of the vessel 20, 30. A thick walled Invar or carbon fiber vessel can be used in an embodiment of the invention. These materials have a high stiffness and a low thermal expansion coefficient. As an alternative and/or to improve the performance, thermal isolation may be used, of a passive type (isolation) and/or of an active type (temperature conditioned).

The problems arising out of the effects mentioned in the previous paragraph may be solved using an absolute pressure sensor 28, 38 in fluid connection with the vessel 20, 30, respectively, as indicated by a dashed line in FIGS. 2, 3, respectively. Absolute pressure sensors are typically based on a resonant element which is stressed by a membrane or bellows which is subjected to a pressure to be measured on one side and absolute vacuum on the other side. The resonant element vibrates with a typical pressure dependent eigen frequency. The eigen frequency is measured accurately by a highly accurate internal clock and dedicated electronics. The longer the time interval available for the measurement, the more accurate the frequency and thereby the absolute pressure can be determined. Since the pressure changes in the vessel 20, 30 are very slow, the absolute pressure sensor 28, 38 can measure with a long time interval (low refresh rate) between updates, in the order of seconds, and a high accuracy, e.g. a factor 10 higher than usual. On the other hand, the differential sensor 26, 36 can be used with a refresh rate of 10 to 100 Hz or higher since the measuring range may be relatively small and the relative measuring error needs not be extremely small. Thus, by employing a combination of an absolute pressure sensor 28, 38 and a differential pressure sensor 26, 36 at the same time an increase in accuracy and an increase in refresh rate may be achieved. Since the pressure variation (gradient) from one absolute pressure sensor update to a subsequent one is quite small, at each update of the differential pressure sensor the pressure measured by the absolute pressure sensor may be accurately estimated from an extrapolation of the previous two updates of the absolute pressure sensor. A great advantage of the high effective refresh rate thus achieved is the possibility for dynamic pressure measuring, in particular in relative rapidly changing ambient space pressure conditions, like the ones occurring in stormy weather.

When using the capillary 24, in an even improved embodiment the integration of formula (2) is performed over a few seconds (instead of the usual longer time), and the update from the absolute pressure sensor is used to calibrate the integration algorithm.

Figure 4:
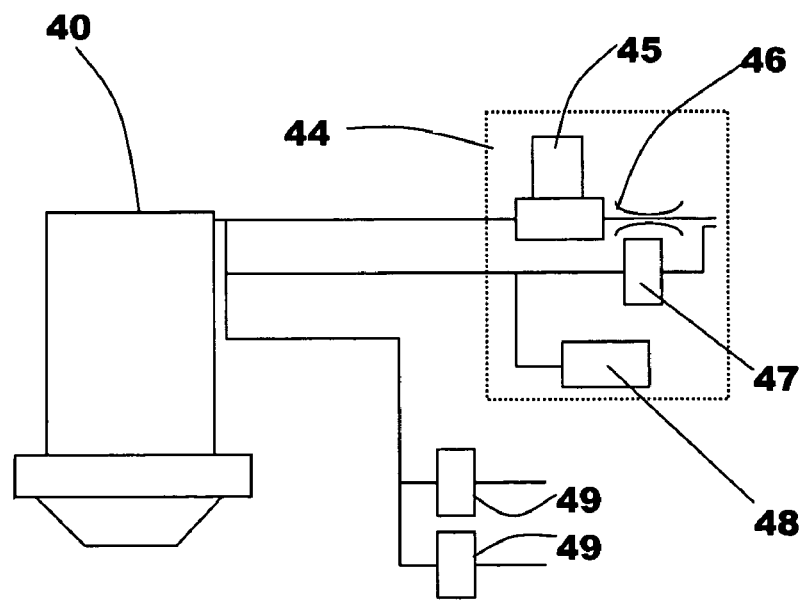
FIG. 4 schematically depicts a part of a positioning device according to a further embodiment of the invention.

As illustrated in FIG. 4, a scanner/stepper projection lens can be used as a reference pressure volume 40 to save the cost of providing a separate vessel. A connection 42 from the vessel 40 to the differential pressure sensor should be made on the lens outlet to avoid lens contamination by the differential pressure sensor. In an embodiment of the invention, the connection is made about 10 to 20 mm after the lens connection in order to have a minimum flow through the connection, and at least separated from a purge flow through the projection lens.

FIG. 4 shows a lens gas system 44 with a flow meter 45, a capillary 46, a differential pressure sensor 47, an absolute pressure sensor 48, and optional further differential pressure sensors 49 measuring pressure differences between the vessel 40 and various other locations than the location of the differential pressure sensor 47. The differential pressure sensors may be used to determine pressure gradients in one or more dimensions in the ambient space, e.g. along the path of a laser beam of a laser interferometer system.

In an embodiment of the invention, the position measuring apparatus of FIG. 4 includes a calculating unit configured to determine a change of pressure in the ambient space based on the pressure difference. In an embodiment of the invention, the calculating unit may include an integrator and an adder that are configured to perform the different operations illustrated above.

Embodiments of the invention also include a position measurement corrector configured to correct a position measurement of the position measurement system.

The accurate and fast ambient pressure measurements according to an embodiment of the invention allow for a correction of a position measurement made in an ambient space by an object position measuring system (such as a laser interferometer system), where the position measurement is influenced by a pressure variation in the ambient space. A fluid connection such as a capillary or a valve between an ambient space and a reference pressure volume is used. In either case, the absolute pressure in the reference pressure volume can be measured or not.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A method for measuring a position of an object in an ambient space with an object position measuring system, said ambient space having a fluid connection with a reference pressure volume, the method comprising:
   (a) measuring an absolute pressure in said reference pressure volume;
   (b) measuring a pressure difference between a pressure in said reference pressure volume and an ambient pressure in said ambient space;
   (c) adding said absolute pressure in said reference pressure volume and said pressure difference to determine a change of pressure in said ambient space, and
   (d) correcting a position measurement of said object position measuring system on the basis of said determined change of pressure in said ambient space.

2. The method of claim 1, wherein the pressure difference between a pressure in said reference pressure volume and an ambient pressure is measured at at least two locations in said ambient space, and wherein the change of pressure is determined at said at least two different locations.

3. The method of claim 2, wherein the at least two locations are situated along a path of measurement of an object position measuring system.

4. A method for measuring a position of an object in an ambient space with an object position measuring system, said ambient space having a fluid connection with a reference pressure volume, the method comprising:
   (a) measuring a pressure difference between a pressure in said reference pressure volume and an ambient pressure in said ambient space;
   (b) integrating said pressure difference over a predetermined time interval for determining a change of pressure in said reference pressure volume
   (c) adding said pressure difference at an end of said predetermined time interval to said change of pressure in the reference pressure volume to determine a change of pressure in said ambient space, and (d) correcting a position measurement of said object position measuring system on the basis of said determined change of pressure in said ambient space.

5. The method of claim 4, further comprising measuring an initial ambient pressure in said ambient space before measuring said pressure difference, and adding said initial ambient pressure to said pressure difference at an end of said predetermined time interval and said change of pressure in the reference pressure volume.

6. The method of claim 4, further comprising measuring an absolute pressure in said reference pressure volume, and using the measurement of the absolute pressure in said reference pressure volume to calibrate said integrating.

7. An apparatus for measuring a position of an object in an ambient space, comprising:
  (a) an object position measuring system arranged in the ambient space and configured to measure a position of the object;
  (b) a reference pressure volume having a fluid connection to said ambient space;
  (c) an absolute pressure sensor configured to measure an absolute pressure in said reference pressure volume;
  (d) a differential pressure sensor configured to measure a pressure difference between a pressure in said reference pressure volume and an ambient pressure in said ambient space;
  (e) an adder configured to add said absolute pressure in said reference pressure volume to said pressure difference to determine a change of pressure in said ambient space; and
  (f) a position measurement corrector configured to correct a position measurement of said object position measuring system on the basis of said determined change of pressure in said ambient space.

8. The apparatus of claim 7, wherein the object position measuring system comprises a laser interferometer system.

9. The apparatus of claim 7, wherein the connection comprises a capillary.

10. The apparatus of claim 7, comprising at least two differential pressure sensors configured to measure a pressure difference between a pressure in said reference pressure volume and an ambient pressure in said ambient space at at least two locations situated along a path of measurement of the object position measuring system.

11. The apparatus of claim 7, wherein the pressure reference volume contains a conductive material.

12. The apparatus of claim 11, wherein the conductive material comprises a fine mesh of highly conductive material.

13. The apparatus of claim 11, wherein the conductive material is temperature conditioned.

14. The apparatus of claim 7, wherein the reference pressure volume is made of a non-expanding material.

15. The apparatus of claim 14, wherein the reference pressure volume is made of Invar.

16. The apparatus of claim 14, wherein the reference pressure volume is made of carbon fiber.

17. An apparatus for measuring a position of an object in an ambient space, the apparatus comprising:
  (a) an object position measuring system arranged in the ambient space and configured to measure a position of the object;
  (b) a reference pressure volume having a fluid connection to said ambient space;
  (c) a differential pressure sensor configured to measure a pressure difference between a pressure in said reference pressure volume and an ambient pressure in said ambient space;
  (d) an integrator configured to integrate said pressure difference over a predetermined time interval for determining a change of pressure in the reference pressure volume,
  (e) an adder configured to add said pressure difference at an end of said predetermined time interval to said change of pressure in the reference pressure volume to determine a change of pressure in said ambient space, and
  (f) a position measurement corrector configured to correct a position measurement of said object position measuring system on the basis of said determined change of pressure in said ambient space.

18. The apparatus of claim 17, further comprising an absolute pressure sensor configured to measure an ambient pressure in said ambient space, the adder being configured to further add said ambient pressure to determine a change of pressure in said ambient space.

19. A lithographic apparatus comprising:
  (a) an illumination system configured to condition a radiation beam;
  (b) a patterning device support configured to support a patterning device, the patterning device being capable of imparting the radiation beam with a pattern in its cross-section to form a patterned radiation beam;
  (c) a substrate support constructed to hold a substrate;
  (d) a projection system configured to project the patterned radiation beam onto a target portion of the substrate; and
  (e) a position measuring apparatus configured to measure a position of one of said supports, the position measuring apparatus comprising:
    (i) an object position measuring system arranged in the ambient space and configured to measure a position of said one support;
    (ii) a reference pressure volume having a fluid connection to said ambient space;
    (iii) an absolute pressure sensor configured to measure an absolute pressure in said reference pressure volume;
    (iv) a differential pressure sensor configured to measure a pressure difference between a pressure in said reference pressure volume and an ambient pressure in said ambient space;
    (v) an adder configured to add said absolute pressure in said reference pressure volume to said pressure difference to determine a change of pressure in said ambient space; and
    (vi) a position measurement corrector configured to correct said a position measurement of said object position measuring system on the basis of said determined change of pressure in said ambient space.

20. The lithographic apparatus of claim 19, wherein the reference pressure volume is a projection lens of the projection system.

21. A lithographic apparatus comprising:
  (a) an illumination system configured to condition a radiation beam;
  (b) a patterning device support configured to support a patterning device, the patterning device being capable of imparting the radiation beam with a pattern in its cross-section to form a patterned radiation beam;
  (c) a substrate support configured to hold a substrate;

(d) a projection system configured to project the patterned radiation beam onto a target portion of the substrate, and
(e) a position measuring apparatus configured to measure a position of one of said supports, the position measuring apparatus comprising:
  (i) a laser interferometer system arranged in the ambient space and configured to measure a position of said one support;
  (ii) a reference pressure volume having a fluid connection to said ambient space;
  (iii) a differential pressure sensor configured to measure a pressure difference between a pressure in said reference pressure volume and an ambient pressure in said ambient space;
  (iv) an integrator configured to integrate said pressure difference over a predetermined time interval for determining a change of pressure in said reference pressure volume;
  (v) an adder configured to add said pressure difference at an end of said predetermined time interval to said change of pressure in the reference pressure volume to determine a change of pressure in said ambient space, and
  (vi) a position measurement corrector configured to correct a position measurement of said laser interferometer system on the basis of said determined change of pressure in said ambient space.

22. A lithographic apparatus arranged to transfer a pattern from a patterning device onto a substrate, comprising:
  (a) a movable object in an ambient space;
  (b) an object position measuring system arranged in the ambient space and configured to measure a position of the object;
  (c) a reference pressure volume having a fluid connection to said ambient space;
  (d) an absolute pressure sensor configured to measure an absolute pressure in said reference pressure volume;
  (e) a differential pressure sensor configured to measure a pressure difference between a pressure in said reference pressure volume and an ambient pressure in said ambient space;
  (f) an adder configured to add said absolute pressure in said reference pressure volume to said pressure difference to determine a change of pressure in said ambient space;
  (g) a position measurement corrector configured to correct said position measurement of said object position measuring system on the basis of said determined change of pressure in said ambient space.

23. A lithographic apparatus arranged to transfer a pattern from a patterning device onto a substrate, comprising:
  (a) a movable object in an ambient space;
  (b) an object position measuring system arranged in the ambient space and configured to measure a position of the object;
  (c) a reference pressure volume having a fluid connection to said ambient space;
  (d) a differential pressure sensor configured to measure a pressure difference between a pressure in said reference pressure volume and an ambient pressure in said ambient space;
  (e) an integrator configured to integrate said pressure difference over a predetermined time interval for determining a change of pressure in said reference pressure volume;
  (f) an adder configured to add said pressure difference at an end of said predetermined time interval to said change of pressure in the reference pressure volume to determine a change of pressure in said ambient space;
  (g) a position measurement corrector configured to correct said position measurement of said object position measuring system on the basis of said determined change of pressure in said ambient space.

24. A method for measuring a position of an object in an ambient space, comprising:
  measuring a pressure difference between a pressure in a reference pressure volume and an ambient pressure in the ambient space;
  determining a change of pressure in the ambient space based on the pressure difference; and
  correcting a position measurement of the object on the basis of the determined change of pressure in the ambient space.

25. An apparatus for measuring a position of an object in an ambient space, comprising:
  an object position measuring system arranged in the ambient space and configured to measure a position of the object;
  a reference pressure volume having a fluid connection to the ambient space;
  a differential pressure sensor configured to measure a pressure difference between a pressure in the reference pressure volume and an ambient pressure in the ambient space;
  a calculating unit configured to determine a change of pressure in the ambient space based on the pressure difference; and
  a position measurement corrector configured to correct the position measurement of the object position measuring system on the basis of the determined change of pressure in the ambient space.

* * * * *

UNITED STATES PATENT AND TRADEMARK OFFICE
CERTIFICATE OF CORRECTION

| | | |
|---|---|---|
| PATENT NO. | : 7,310,130 B2 | Page 1 of 1 |
| APPLICATION NO. | : 10/957755 | |
| DATED | : December 18, 2007 | |
| INVENTOR(S) | : Emiel Jozef Melanie Eussen et al. | |

It is certified that error appears in the above-identified patent and that said Letters Patent is hereby corrected as shown below:

On title page, item (75) Inventors:
replace "Rudolf Van-Empel"
with --Rudolf Van Empel--.

Signed and Sealed this

Fourteenth Day of October, 2008

JON W. DUDAS
*Director of the United States Patent and Trademark Office*